(12) United States Patent
Tsai et al.

(10) Patent No.: US 11,742,832 B2
(45) Date of Patent: Aug. 29, 2023

(54) TRANSMISSION-END IMPEDANCE MATCHING CIRCUIT

(71) Applicant: REALTEK SEMICONDUCTOR CORPORATION, Hsinchu (TW)

(72) Inventors: Chien-Hui Tsai, Hsinchu (TW); Hung-Chen Chu, Hsinchu (TW); Yung-Tai Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/727,856

(22) Filed: Apr. 25, 2022

(65) Prior Publication Data

US 2023/0006652 A1   Jan. 5, 2023

(30) Foreign Application Priority Data

Jul. 5, 2021   (TW) .................. 110124679

(51) Int. Cl.
*H03K 19/00*   (2006.01)
*H03H 11/28*   (2006.01)
*H03H 11/24*   (2006.01)

(52) U.S. Cl.
CPC ........... *H03H 11/28* (2013.01); *H03H 11/245* (2013.01); *H03K 19/0005* (2013.01)

(58) Field of Classification Search
None
See application file for complete search history.

(56) References Cited

U.S. PATENT DOCUMENTS

| | | | | |
|---|---|---|---|---|
| 7,501,851 | B2* | 3/2009 | Venditti | H03K 19/018557 326/26 |
| 8,446,173 | B1* | 5/2013 | Faucher | H03K 19/017509 326/86 |
| 9,030,248 | B2* | 5/2015 | Kim | H03K 19/00369 326/62 |
| 10,965,116 | B2 | 3/2021 | Yu et al. | |

* cited by examiner

*Primary Examiner* — Anh Q Tran
(74) *Attorney, Agent, or Firm* — WPAT, P.C

(57) ABSTRACT

A transmission-end impedance matching circuit operates according to a signal of an overvoltage signal source and includes a first level shifter, a voltage generating circuit, and an impedance matching circuit. The first level shifter generates a first conversion voltage according to a source signal and operates between a first high voltage and a ground voltage. The voltage generating circuit generates a second high voltage according to the first conversion voltage, the first high voltage, and a medium voltage. The impedance matching circuit includes a second level shifter, a transistor, and two resistors. The second level shifter generates a gate voltage according to the second high voltage, a low voltage, and an input signal. The transistor is turned on/off according to the gate voltage and has a withstand voltage lower than the first high voltage. Each of the two resistors is coupled between the transistor and a differential signal transmission end.

10 Claims, 5 Drawing Sheets

TRANSMISSION-END IMPEDANCE MATCHING CIRCUIT

BACKGROUND OF THE INVENTION

1. Field of the Invention

The present disclosure relates to an impedance matching circuit, especially to an impedance matching circuit capable of operating according to a signal of an overvoltage signal source.

2. Description of Related Art

A general wideband network system has to pass the InterOperability Laboratory Specification (IOL Spec) to prove its compatibility, and the transmission end of this system has to fulfill the requirements of impedance matching. The impedance matching is usually realized with an impedance matching circuit. The impedance matching circuit is usually implemented with an I/O device of a CMOS process. FIG. 1 shows a conventional impedance matching circuit 100 including an NMOS transistor 110, a first resistor 120, and a second resistor 130, wherein the NMOS transistor 110 is turned on or turned off according to a toggle signal, the first resistor 120 is coupled between a first signal output terminal OUTP and the NMOS transistor 110, and the second resistor 130 is coupled between a second signal output terminal OUTN and the NMOS transistor 110.

In regard to the above description, although an I/O device has a higher withstand voltage in comparison with a core device, the withstand voltage of the I/O device may only be 1.8V if the I/O device is manufactured with some advanced process (e.g., a FinFET process). The I/O device of a low withstand voltage can't operate according to a toggle signal of a wide voltage range. For example, if the impedance matching circuit 100 of FIG. 1 is manufactured with an advanced process, the NMOS transistor 110 can only operate according to a toggle signal of a narrow voltage range (e.g., 0~1.8V) instead of a wide voltage range (e.g., 0~3.3V) because the toggle signal of a high voltage may damage the NMOS transistor 110.

SUMMARY OF THE INVENTION

An object of the present disclosure is to provide a transmission-end impedance matching circuit as an improvement over the prior art.

The transmission-end impedance matching circuit of the present disclosure includes: a first level shifter, a voltage generating circuit, and an impedance matching circuit. The first level shifter is configured to generate a first conversion voltage according to a source signal and operate in a first voltage range, wherein the first voltage range is between a first high voltage and a ground voltage, and the first high voltage is higher than a medium voltage. The voltage generating circuit is configured to generate a second high voltage according to the first conversion voltage, the first high voltage, and the medium voltage, wherein the second high voltage is lower than the first high voltage. The impedance matching circuit includes N matching circuit(s), wherein the N is a positive integer. Each of the N matching circuit(s) includes a second level shifter, a transistor, a first resistor, and a second resistor. The second level shifter is coupled to the voltage generating circuit and configured to generate a gate voltage according to an input signal and operate in a second voltage range, wherein the second voltage range is between the second high voltage and a low voltage, the low voltage is greater than zero and lower than the second high voltage, and the gate voltage falls within the second voltage range. The transistor includes a gate, a first transistor terminal, a second transistor terminal, and a base, wherein the gate is configured to receive the gate voltage, the base is configured to receive a base voltage, the transistor is turned on or turned off according to the gate voltage, and a withstand voltage of the transistor is lower than the first high voltage. The first resistor is coupled between the first transistor terminal and a first transmission end of a differential signal. The second resistor is coupled between the second transistor terminal and a second transmission end of the differential signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a transmission-end impedance matching circuit capable of operating according to a signal (e.g., the gate voltage $V_G$ mentioned in the later paragraph) of an overvoltage signal source. The transmission-end impedance matching circuit can be applied to a wired network transmitter and be in the form an integrated circuit, but the application and the form of the transmission-end impedance matching circuit are not limited thereto.

Figure 2:
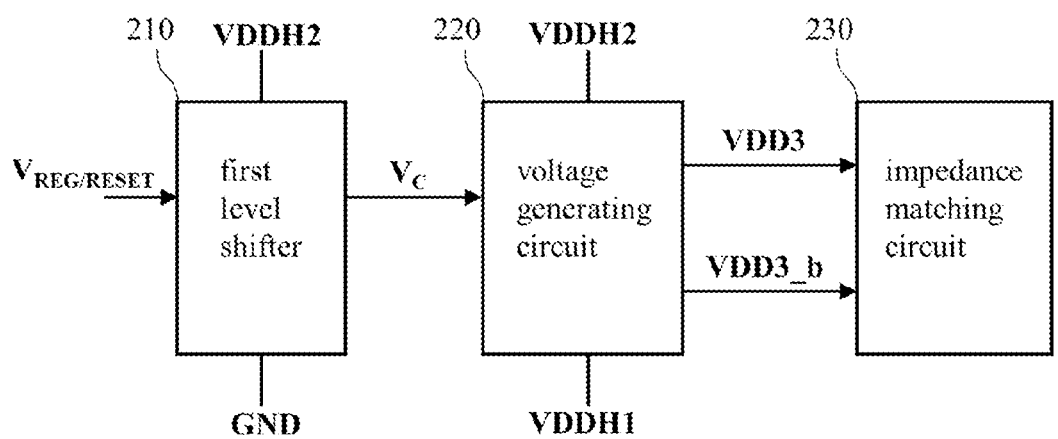
FIG. 2 shows an embodiment of the transmission-end impedance matching circuit of the present disclosure.

FIG. 2 shows an embodiment of the transmission-end impedance matching circuit of the present disclosure. The transmission-end impedance matching circuit 200 of FIG. 2 includes a first level shifter 210, a voltage generating circuit 220, and an impedance matching circuit 230. These circuits are described in detail in the following paragraphs.

In regard to the embodiment of FIG. 2, the first level shifter 210 is configured to generate a first conversion voltage $V_C$ according to a source signal $V_{REG/RESET}$ and operate in a first voltage range. The first voltage range is between a first high voltage VDDH2 (e.g., 3.3V) and a ground voltage GND (0V), and the first high voltage VDDH2 is higher than a medium voltage VDDH1. An example of the source signal $V_{REG/RESET}$ is an output signal from a general level shifter (not shown); more specifically, the general level shifter converts an output of a circuit in a core power domain into the output signal. In an exemplary implementation, when the source signal $V_{REG/RESET}$ is at a low voltage level (e.g., 0V), the first conversion voltage $V_C$ is the medium voltage VDDH1; and when the source signal $V_{REG/RESET}$ is at a high voltage level (e.g., 1.8V), the first conversion signal $V_C$ is the first high voltage VDDH2. The first level shifter 210 can be a known/self-developed circuit which falls beyond the scope of the present disclosure.

Figure 3:
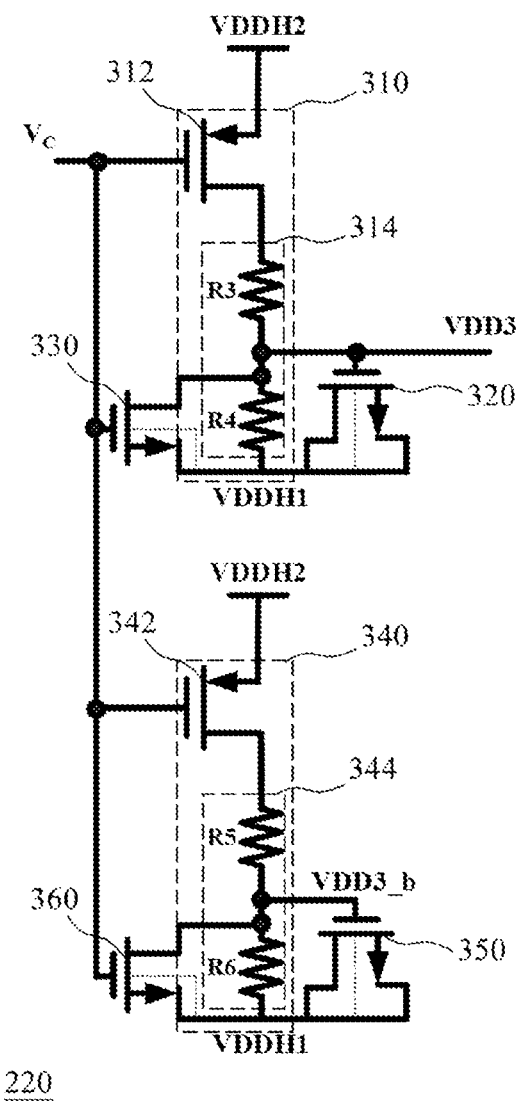
FIG. 3 shows an embodiment of the voltage generating circuit of FIG. 2.

In regard to the embodiment of FIG. 2, the voltage generating circuit 220 is configured to generate a second high voltage VDD3 (e.g., 3V) and a base voltage VDD3_b according to the first conversion voltage $V_C$, the first high voltage VDDH2, and the medium voltage VDDH1, wherein the second high voltage VDD3 is lower than the first high voltage VDDH2. FIG. 3 shows an embodiment of the voltage generating circuit 220 including a first voltage generating circuit 310, a first voltage-regulation capacitor 320, a first clamp switch 330, a second voltage generating circuit 340, a second voltage-regulation capacitor 350, and a second clamp switch 360. The circuits of FIG. 3 are described below.

In regard to the embodiment of FIG. 3, the first voltage generating circuit 310 is configured to generate the second high voltage VDD3 and includes a first operation switch 312 and a first voltage-division circuit 314. In FIG. 3, the first operation switch 312 is a PMOS transistor and the first voltage-division circuit 314 includes two resistors (R3, R4), but the implementation of the first voltage generating circuit 310 is not limited thereto. The first operation switch 312 is coupled between a first high voltage terminal and the first voltage-division circuit 314 and is configured to be turned on or turned off according to the first conversion voltage $V_C$, wherein the voltage at the first high voltage terminal is the first high voltage VDDH2. The first voltage-division circuit 314 is coupled between the first operation switch 312 and a medium voltage terminal, wherein the voltage at the medium voltage terminal is the medium voltage VDDH1. When the first operation switch 312 is turned on, the first voltage-division circuit 314 generates the second high voltage VDD3 according to the first high voltage VDDH2 and the medium voltage VDDH1, and outputs the second high voltage VDD3 via a first voltage-division output terminal (i.e., the node between the two resistors (R3, R4)).

In regard to the embodiment of FIG. 3, the first voltage-regulation capacitor 320 is coupled between the first voltage-division output terminal and the medium voltage terminal. In FIG. 3, the first voltage-regulation capacitor 320 is a MOS capacitor, but the implementation of the first voltage-regulation capacitor 320 is not limited thereto. The first clamp switch 330 (e.g., a deep N-well transistor) is coupled between the first voltage-division output terminal and the medium voltage terminal; in a first mode, the first clamp switch 330 is turned off according to the first conversion voltage $V_C$; and in a second mode, the first clamp switch 330 is turned on according to the first conversion voltage $V_C$ and then pulls the voltage at the first voltage-division output terminal (i.e., the voltage at the node between the two resistors (R3, R4)) to the medium voltage VDDH1. In FIG. 3, the first clamp switch 330 is a NMOS transistor, the first operation switch 312 is a PMOS transistor, and the two transistors won't be fully turned on concurrently. It should be noted that the base of the first clamp switch 330 can be coupled to the medium voltage terminal as illustrated with the dotted line in FIG. 3, but the implementation of the first clamp switch 330 is not limited thereto. It should also be noted that the first voltage-regulation capacitor 320 and the first clamp switch 330 can be omitted according to the demand for implementation.

In regard to the embodiment of FIG. 3, the second voltage generating circuit 340 is configured to generate the base voltage VDD3_b and includes a second operation switch 342 and a second voltage-division circuit 344. In FIG. 3, the second operation switch 342 is a PMOS transistor and the second voltage-division circuit 344 includes two resistors (R5, R6), but the implementation of the second voltage generating circuit 340 is not limited thereto. The second operation switch 342 is coupled between the first high voltage terminal and the second voltage-division circuit 344, and is configured to be turned on or turned off according to the first conversion voltage $V_C$. The second voltage-division circuit 344 is coupled between the second operation switch 342 and the medium voltage terminal. When the second operation switch 342 is turned on, the second voltage-division circuit 344 generates the base voltage VDD3_b according to the first high voltage VDDH2 and the medium voltage VDDH1, and outputs the base voltage VDD3_b via a second voltage-division output terminal (i.e., the node between the two resistors (R5, R6)). In an exemplary implementation, the base voltage VDD3_b is equal to the second high voltage VDD3, but the present invention is not limited thereto.

In regard to the embodiment of FIG. 3, the second voltage-regulation capacitor 350 is coupled between the second voltage-division output terminal and the medium voltage terminal. In FIG. 3, the second voltage-regulation capacitor 350 is a MOS capacitor, but the implementation of the second voltage-regulation capacitor 350 is not limited thereto. The second clamp switch 360 (e.g., a deep N-well transistor) is coupled between the second voltage-division output terminal and the medium voltage terminal; in a first mode, the second clamp switch 360 is turned off according to the first conversion voltage $V_C$; and in a second mode, the second clamp switch 360 is turned on according to the first conversion voltage $V_C$ and then pulls the voltage at the second voltage-division output terminal to the medium voltage VDDH1. In FIG. 3, the second clamp switch 360 is a NMOS transistor, the second operation switch 342 is a PMOS transistor, and the two transistors won't be fully turned on concurrently. It should be noted that the base of the second clamp switch 360 can be coupled to the medium voltage terminal as illustrated with the dotted line in FIG. 3, but the implementation of the second clamp switch 360 is not limited thereto. It should also be noted that the second voltage generating circuit 340, the second voltage-regulation capacitor 350, and the second clamp switch 360 can be omitted according to the demand for implementation. If the second voltage generating circuit 340, the second voltage-regulation capacitor 350, and the second clamp switch 360 are omitted, the base voltage VDD3_b is supplied by another circuit (e.g., a constant voltage source).

Figure 4:
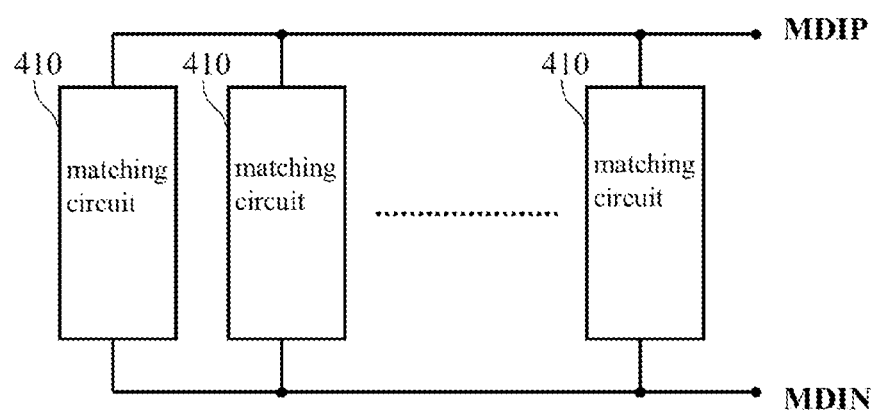
FIG. 4 shows an embodiment of the N matching circuits included in the impedance matching circuit of FIG. 2.
Figure 5:
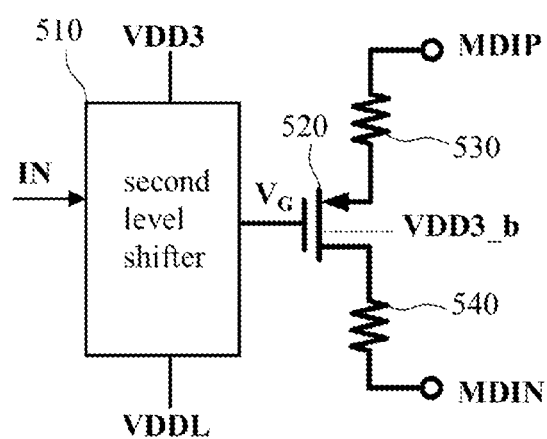
FIG. 5 shows an embodiment of each matching circuit of FIG. 4.

In regard to the embodiment of FIG. 2, the impedance matching circuit 230 includes N matching circuit(s), wherein the N is a positive integer. FIG. 4 shows an embodiment of the N matching circuit(s). In FIG. 4, the number of matching circuits 410 is greater than one, and the N matching circuits 410 are coupled in parallel for operation. FIG. 5 shows an embodiment of each matching circuit 410 including a second level shifter 510, a transistor 520, a first resistor 530, and a second resistor 540. The circuits of FIG. 5 are described below.

In regard to the embodiment of FIG. 5, the second level shifter 510 is coupled to the voltage generating circuit 220 to receive the second high voltage VDD3 and the base voltage VDD3_b, and the second level shifter 510 is configured to generate a gate voltage $V_G$ according to an input signal IN and operate in a second voltage range. The second voltage range is between the second high voltage VDD3 and a low voltage VDDL (e.g., 0.9V), wherein the low voltage VDDL is greater than zero and lower than the second high voltage VDD3. The gate voltage $V_G$ falls within the second voltage range (e.g., 0.9V~3V). In an exemplary implementation, when the input signal IN is at a low voltage level (e.g., 0V), the gate voltage $V_G$ is equal to the low voltage VDDL; and when the input signal IN is at a high voltage level (e.g., 1.8V), the gate voltage $V_G$ is equal to the second high voltage VDD3. The second level shifter 510 can be a known/self-developed circuit which falls beyond the scope of the present disclosure.

In regard to the embodiment of FIG. 5, the transistor 520 includes a gate, a first transistor terminal, a second transistor terminal, and a base. The gate is configured to receive the aforementioned gate voltage $V_G$. The base is configured to receive the aforementioned base voltage VDD3_*b*. Normally, the base voltage VDD3_*b* is not lower than the voltage at any terminal of the transistor 520 to prevent leakage problems, but the implementation of the base voltage VDD3_*b* is not limited thereto. The transistor 520 is turned on or turned off according to the gate voltage $V_G$, and has a withstand voltage (e.g., 1.8V) lower than the first high voltage VDDH2 (e.g., 3.3V); however, the voltage difference between any two terminals of the transistor 520 won't be excessive under the circuit configuration of FIG. 2. Even though the above-mentioned voltage difference slightly exceeds the withstand voltage of the transistor 520, this limited overvoltage is tolerable to the transistor 520.

Figure 1:
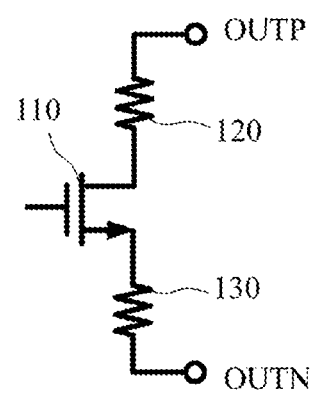
FIG. 1 shows a conventional impedance matching circuit.

It should be noted that the transistor 520 of FIG. 5 is a PMOS transistor, but the present invention is not limited thereto. In comparison with the prior art of FIG. 1 using an NMOS transistor 110 having a lower withstand voltage, the embodiment of FIG. 5 uses the PMOS transistor 520 having a higher withstand voltage to enhance the reliability of the matching circuit 410. In addition, the transistor 520 can be a component manufactured with an advanced process (e.g., a FinFET process).

In regard to the embodiment of FIG. 5, the first resistor 530 (e.g., a polysilicon resistor of a CMOS process) is coupled between the first transistor terminal and a first transmission end MDIP of a differential signal. The second resistor 540 (e.g., a polysilicon resistor of a CMOS process) is coupled between the second transistor terminal and a second transmission end MDIN of the differential signal. The resistance of the first resistor 530 and the resistance of the second resistor 540 can be the same or different. The signal at the first transmission end MDIP is a first part of the differential signal and the signal at the second transmission end MDIN is a second part of the differential signal, and the first part and the second part are complementary. In this embodiment, the signal voltage at each of the first transmission end MDIP and the second transmission end MDIN falls within a third voltage range (e.g., 0.4V~2.9V), and the upper limit of the third voltage range is higher than the withstand voltage (e.g., 1.8V) of the transistor 520; however, the voltage difference between any two terminals of the transistor 520 is lower than the withstand voltage or approximates to the withstand voltage, and this voltage difference won't cause damage to the transistor 520.

It should be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the transmission-end impedance matching circuit of the present disclosure can operate according to a signal of an overvoltage signal source and won't be damaged by the signal.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A transmission-end impedance matching circuit comprises:
    a first level shifter configured to generate a first conversion voltage according to a source signal and operate in a first voltage range;
    a voltage generating circuit configured to generate a second high voltage according to the first conversion voltage, a first high voltage, and a medium voltage, wherein the second high voltage is lower than the first high voltage; and
    an impedance matching circuit including N matching circuit(s), wherein the N is a positive integer, and each of the N matching circuit(s) includes:
    a second level shifter coupled to the voltage generating circuit and configured to generate a gate voltage according to an input signal and operate in a second voltage range, wherein the second voltage range is between the second high voltage and a low voltage, the low voltage is greater than zero and lower than the second high voltage, and the gate voltage falls within the second voltage range;
    a transistor including a gate, a first transistor terminal, a second transistor terminal, and a base, wherein the gate is configured to receive the gate voltage, the base is configured to receive a base voltage, the transistor is turned on or turned off according to the gate voltage, and a withstand voltage of the transistor is lower than the first high voltage;
    a first resistor coupled between the first transistor terminal and a first transmission end of a differential signal; and
    a second resistor coupled between the second transistor terminal and a second transmission end of the differential signal.

2. The transmission-end impedance matching circuit of claim 1, wherein the voltage generating circuit includes:
    a first voltage generating circuit configured to generate the second high voltage, the first voltage generating circuit including a first operation switch and a first voltage-division circuit, wherein:
        the first operation switch is coupled between a first high voltage terminal and the first voltage-division circuit, and configured to be turned on or turned off according to the first conversion voltage, and a voltage at the first high voltage terminal is the first high voltage;
        the first voltage-division circuit is coupled between the first operation switch and a medium voltage terminal, and a voltage at the medium voltage terminal is the medium voltage; and
        when the first operation switch is turned on, the first voltage-division circuit generates the second high voltage according to the first high voltage and the medium voltage, and outputs the second high voltage via a first voltage-division output terminal.

3. The transmission-end impedance matching circuit of claim 2, wherein the first voltage generating circuit further includes a first voltage-regulation capacitor, and the first voltage-regulation capacitor is coupled between the first voltage-division output terminal and the medium voltage terminal.

4. The transmission-end impedance matching circuit of claim 2, wherein the first voltage generating circuit further includes a first clamp switch; the first clamp switch is coupled between the first voltage-division output terminal and the medium voltage terminal; in a first mode, the first clamp switch is turned off according to the first conversion voltage; and in a second mode, the first clamp switch is turned on according to the first conversion voltage and then pulls a voltage at the first voltage-division output terminal to the medium voltage.

5. The transmission-end impedance matching circuit of claim 2, wherein the voltage generating circuit further includes:
a second voltage generating circuit configured to generate the base voltage, the second voltage generating circuit including a second operation switch and a second voltage-division circuit, wherein:
the second operation switch is coupled between the first high voltage terminal and the second voltage-division circuit, and configured to be turned on or turned off according to the first conversion voltage;
the second voltage-division circuit is coupled between the second operation switch and the medium voltage terminal; and
when the second operation switch is turned on, the second voltage-division circuit generates the base voltage according to the first high voltage and the medium voltage, and outputs the base voltage via a second voltage-division output terminal.

6. The transmission-end impedance matching circuit of claim 5, wherein the second voltage generating circuit further includes a second voltage-regulation capacitor, and the second voltage-regulation capacitor is coupled between the second voltage-division output terminal and the medium voltage terminal.

7. The transmission-end impedance matching circuit of claim 5, wherein the second voltage generating circuit further includes a second clamp switch; the second clamp switch is coupled between the second voltage-division output terminal and the medium voltage terminal; in a first mode, the second clamp switch is turned off according to the first conversion voltage; and in a second mode, the second clamp switch is turned on according to the first conversion voltage and then pulls a voltage at the second voltage-division output terminal to the medium voltage.

8. The transmission-end impedance matching circuit of claim 1, wherein the N is greater than one, and the N matching circuits are coupled in parallel.

9. The transmission-end impedance matching circuit of claim 1, wherein the base voltage is not lower than a voltage at any terminal of the transistor.

10. The transmission-end impedance matching circuit of claim 1, wherein a signal voltage of each of the first transmission end and the second transmission end of the differential signal falls within a third voltage range, and an upper limit of the third voltage range is higher than the withstand voltage of the transistor.

\* \* \* \* \*